(12) United States Patent
Iisaka

(10) Patent No.: US 6,591,219 B1
(45) Date of Patent: Jul. 8, 2003

(54) METHOD AND APPARATUS FOR CORRECTING ELECTRIC-COMPONENT-MOUNT POSITION

(75) Inventor: Jun Iisaka, Nissin (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 344 days.

(21) Appl. No.: 09/637,009

(22) Filed: Aug. 14, 2000

(30) Foreign Application Priority Data

Aug. 18, 1999 (JP) .......................................... 11-231555

(51) Int. Cl.⁷ ............................................. G01C 9/00
(52) U.S. Cl. ..................................................... 702/152
(58) Field of Search ..................... 702/152; 29/25.01, 29/832, 833, 837; 348/126; 382/145, 149, 147; 356/394

(56) References Cited

U.S. PATENT DOCUMENTS 6,171,350 B1 * 1/2001 Kida ......................... 29/25.01
6,333,992 B1 * 12/2001 Yamamura et al. .......... 348/126

FOREIGN PATENT DOCUMENTS

| JP | 8-236997 | | 9/1996 |
| JP | 8-288695 | A | 11/1996 |
| JP | 9-237997 | | 9/1997 |
| JP | 9-283994 | A | 10/1997 |
| JP | 11-204995 | | 7/1999 |

* cited by examiner

*Primary Examiner*—John Barlow
*Assistant Examiner*—Tung Lau
(74) *Attorney, Agent, or Firm*—Oliff & Berridge, PLC

(57) ABSTRACT

A method of determining, according to a dimensional and/or positional error of an actual board, an actual mounting position where a component is to be mounted on the actual board, on a coordinate system defined by a first and a second axis, including the steps of obtaining a relative position of an ideal mounting position, relative to four ideal reference-point positions, as four division ratios in which four ideal sides of a quadrilateral defined by the four ideal reference points are divided by two first division points where a first ideal line parallel to the first axis and passing through the ideal mounting position intersects two first ideal sides of the quadrilateral, and two second division points where a second ideal line parallel to the second axis and passing through the ideal mounting position intersects two second ideal sides of the quadrilateral, detecting four actual reference-point positions on the actual board, calculating four actual division-point positions which respectively divide, in the four division ratios, four actual sides of a quadrilateral defined by the four actual reference-point positions, and calculating the actual mounting position where a first actual line passing through two first points of the four actual division points intersects a second actual line passing through two second points of the four actual division points.

12 Claims, 6 Drawing Sheets

METHOD AND APPARATUS FOR CORRECTING ELECTRIC-COMPONENT-MOUNT POSITION

BACKGROUND OF INVENTION

1. Field of Invention

The present invention relates to a method of mounting an electric component on a printed-wiring board and particularly to the art of correcting, according to a dimensional error and/or a positional error of the printed-wiring board, a mounting position where the electric component is to be mounted.

2. Related Art Statement

A plurality of ideal mounting positions where respective electric components ("ECs") are to be mounted on an ideal printed-wiring board ("PWB") having no dimensional errors or no positional errors, are determined in advance and are pre-stored in a memory. However, before ECs are mounted on an actual PWB, the actual PWB may have at least one dimensional error and/or at least one positional error, for example, because the PWB is produced with at least one erroneous dimension, because the PWB is deformed due to heat or external force applied thereto, and/or because the PWB is erroneously positioned relative to an EC mounting device which is for mounting the ECs on the PWB. In this case, the ideal mounting positions should be modified. The actual PWB has an electrically conductive pattern (e.g., land or pad) at a mounting position where each EC is to be mounted. If the actual PWB has a dimensional error and/or a positional error, the conductive pattern thereof should also have a positional error. If each of the ideal mounting positions is not modified or corrected according to the positional error and/or positional error of the PWB, the electrodes of each EC may not correctly placed on the conductive pattern of the PWB. Japanese Patent Publication No. 8-236997 discloses a method of correcting an ideal EC-mount position according to a dimensional error of a PWB. This conventional method includes (a) calculating a first reference straight line which passes through an ideal EC-mount position and divides, in a first division ratio, each of a first pair of opposed sides of an ideal quadrilateral defined by respective ideal position of four reference points, and a second reference straight line which passes through the ideal EC-mount position and divides, in a second division ratio, each of a second pair of opposed sides of the quadrilateral, and (b) determining, based on the first and second division ratios for dividing the four sides of the ideal quadrilateral, and respective detected actual positions of the four reference points on an actual PWB, an actual EC-mount position where an EC is to be mounted on the actual PWB. Thus, the electrodes of the EC are correctly placed on a conductive pattern of the PWB.

However, the calculations needed for determining the two reference straight lines which divide, in the first and second division ratios, the four sides of the ideal quadrilateral are very complex, which leads to increasing a time needed for processing all the ideal EC-mount positions predetermined for each PWB.

SUMMARY OF INVENTION

The present invention provides an actual-mounting-position determining method, an electric-component mounting apparatus, an actual-mounting-position determining apparatus, and a mounting-position-correcting-program recording medium which have one or more of the following technical features that are described in below in respective paragraphs given parenthesized sequential numbers (1) to (9). Any technical feature which includes another technical feature shall do so by referring, at the beginning, to the parenthesized sequential number given to the latter feature. Thus, two or more of the following technical features may be combined, if appropriate. Each technical feature may be accompanied by a supplemental explanation, as needed. However, the following technical features and the appropriate combinations thereof are just examples to which the present invention is by no means limited. In addition, in the case where one technical feature recites a plurality of items, it is not essentially required that all of those items be simultaneously employed. That is, it is possible to select and employ only a portion (one, two, but not all) of those items.

(1) According to a first feature of the present invention, there is provided a method of determining, according to at least one of at least one dimensional error and at least one positional error of an actual printed-wiring board, an actual mounting position where an actual electric component is to be mounted on the actual board, on a two-dimensional coordinate system defined by a first axis and a second axis, the method comprising the steps of obtaining an ideal relative position of an ideal mounting position which corresponds to the actual mounting position and where an ideal electric component which corresponds to the actual electric component is to be mounted on an ideal printed-wiring board which corresponds to the actual printed-wiring board and which has no dimensional error and no positional error, the ideal relative position being defined as a position of the ideal mounting position relative to four ideal reference-point positions as respective ideal positions of four ideal reference points predetermined on the ideal printed-wiring board, and being defined by four division ratios in which four ideal sides of an ideal quadrilateral defined by the four ideal reference-point positions are respectively divided by two first ideal division points where a first ideal reference line which is parallel to the first axis of the two-dimensional coordinate system and passes through the ideal mounting position intersects a first pair of opposed ideal sides of the four ideal sides of the ideal quadrilateral, and two second ideal division points where a second ideal reference line which is parallel to the second axis of the coordinate system and passes through the ideal mounting position intersects a second pair of opposed ideal sides of the four ideal sides of the ideal quadrilateral, detecting four actual reference-point positions as respective actual positions of four actual reference points which correspond to the four ideal reference points, respectively, and which are predetermined on the actual printed-wiring board on which the actual electric component is to be mounted, calculating, based on the four division ratios and the four actual reference-point positions, four actual division-point positions as respective actual positions of four actual division points which respectively divide, in the four division ratios, four actual sides of an actual quadrilateral defined by the four actual reference-point positions, and calculating, as the actual mounting position, a position of an intersecting point where a first actual reference line which passes through two first actual division points of the four actual division points that correspond to the two first ideal division points, intersects a second actual reference line which passes through two second actual division points of the four actual division points that correspond to the two second ideal division points.

In the present method, the two ideal reference lines are employed which are independent of the four ideal reference-point positions, and the four division ratios in which the four sides of the ideal quadrilateral defined by the four ideal reference-point positions are divided by the four intersecting or division points where the two ideal reference lines intersect the four sides of the ideal quadrilateral, are determined. Those calculations are much simpler than those of the above-explained conventional method. In addition, since the two ideal reference lines are parallel to the first and second axes of the coordinate system, at least one of the x and y coordinates of each of the four intersecting points of the two ideal reference lines and the four sides is equal to a corresponding one of the x and y coordinates of the ideal mounting position. Because of this, the other of the x and y coordinates of the each of the four intersecting points can be easily determined. Each of the four ideal or actual division ratios may be an "inside" or "outside" division ratio. For example, irrespective of whether the ideal mounting position may be located inside or outside the ideal quadrilateral, four division ratios can be similarly determined and, based on the four division ratios and the detected four actual reference-point positions, four actual division points can be calculated, and the intersecting point of the two actual reference lines can be determined as the actual mounting position. However, in the case where the ideal mounting position is located outside the ideal quadrilateral, one or more of the four sides of the ideal quadrilateral may be extended to find one or more intersecting points where one or more ideal reference lines intersect the one or more sides of the ideal quadrilateral. Here, an "inside" division ratio may be (a1) an internal-division ratio as the ratio of the length of one of two inside segments obtained by dividing one side of an ideal quadrilateral at an inside division point between the two ideal reference points defining the one side, to the length of the other inside segment, or (a2) an inside-segment ratio as the ratio of the length of one of the two inside segments to the entire length of the one side. In the case where an ideal division point is an outside division point located on an extended portion of one side, an "outside" division ratio may be (b1) an external-division ratio as the ratio of the distance between the outside division point and one of the two ideal reference points defining the one side, to the distance between the outside division point and the other ideal reference point, or (b2) an outside-segment ratio as the ratio of the distance between the outside division point and one of the two ideal reference points defining the one side, to the entire length of the one side. The four division ratios as the ideal relative position of one ideal mounting position, or each of a plurality of ideal mounting positions, may be calculated in advance and pre-stored in a memory, so that the four division ratios may be read from the memory, when needed. Alternatively, each time four division ratios are needed, the four division ratios may be calculated based on the ideal mounting position and the four ideal fiducial-mark positions. Otherwise, four division points which are calculated for a certain mounting position on a first or initial PWB, may be stored in a memory, so that the four division points may be read from the memory when an EC is mounted on the corresponding mounting position on each of the second and following PWBs.

(2) According to a second feature of the present invention that includes the first feature (1), the step of calculating the actual mounting position comprises calculating, as at least one correction amount, at least one amount of deviation of the actual mounting position from the ideal mounting position, so that at least one of the actual electric component and the actual printed-wiring board is displaced relative to the other of the actual electric component and the actual board by the correction amount before the actual electric component is mounted on the actual board.

When the thus calculated correction amount is added to the ideal mounting position, and/or a prescribed amount of movement of an EC mounting head, which is or are determined in advance and incorporated into an EC mounting program, the EC can be accurately mounted on a conductive pattern provided on the PWB.

(3) According to a third feature of the present invention that includes the first or second feature (1) or (2), the step of calculating the actual mounting position comprises calculating, based on at least one of respective angular deviations of respective slopes of the first and second actual reference lines from respective slopes of the first and second ideal reference lines, an angular correction amount as an amount of deviation of an actual angular position of the actual printed-wiring board from an ideal angular position of the ideal printed-wiring board about an axis line perpendicular to an upper surface of the actual board, so that at least one of the actual electric component and the actual board is rotated about the axis line by the angular correction amount before the actual electric component is mounted on the actual board.

In the case where the present method calculates the angular correction amount in addition to a positional correction amount, the actual mounting position more accurately reflects, and accommodates, the dimensional and/or positional errors of the actual PWB. The angular correction amount may be determined based on an angular deviation of the slope of a pre-selected one of the two actual reference lines from that of a corresponding one of the two ideal reference lines, or based on respective angular deviations of the respective slopes of the two actual reference lines from those of the corresponding ideal reference lines.

(4) According to a fourth feature of the present invention that includes the third feature (3), the step of calculating the angular correction amount comprises calculating the angular correction amount as an average of the respective angular deviations of the respective slopes of the first and second actual reference lines from the respective slopes of the first and second ideal reference lines.

(5) According to a fifth feature of the present invention that includes any one of the first to fourth features (1) to (4), the step of detecting the four actual reference-point positions comprises detecting respective amounts of positional deviations of the four actual reference-point positions from the four ideal reference-point positions in each of a first direction and a second direction which are parallel to the first and second axes of the two-dimensional coordinate system, respectively, and detecting the four actual reference-point positions as respective sums of the four ideal reference-point positions and the respective amounts of positional deviations of the four actual reference-point positions.

Alternatively, the four actual reference-point positions may be detected or recognized as respective of combinations of coordinates, e.g., respective sets of x and y coordinates.

(6) According to a sixth feature of the present invention, there is provided an electric-component mounting apparatus comprising a mounting device which mounts at least one actual electric component at least one actual mounting position on an actual printed-wiring board having at least one of at least one dimensional error and at least one positional error; control device which controls the mounting device to mount, on a two-dimensional coordinate system defined by a first axis and a second axis, the actual electric component at the actual mounting position on the actual printed-wiring board; and an image taking device which takes an image of the actual printed-wiring board, the control device comprising an ideal-relative-position obtaining portion which obtains an ideal relative position of an ideal mounting position which corresponds to the actual mounting position and where an ideal electric component which corresponds to the actual electric component is to be mounted on an ideal printed-wiring board which corresponds to the actual printed-wiring board and which has no dimensional error and no positional error, the ideal relative position being defined as a position of the ideal mounting position relative to four ideal reference-point positions as respective ideal positions of four ideal reference points predetermined on the ideal printed-wiring board, and being defined by four division ratios in which four ideal sides of an ideal quadrilateral defined by the four ideal reference-point positions are respectively divided by two first ideal division points where a first ideal reference line which is parallel to the first axis of the two-dimensional coordinate system and passes through the ideal mounting position intersects a first pair of opposed ideal sides of the four ideal sides of the ideal quadrilateral, and two second ideal division points where a second ideal reference line which is parallel to the second axis of the coordinate system and passes through the ideal mounting position intersects a second pair of opposed ideal sides of the four ideal sides of the ideal quadrilateral, an actual-reference-point-position detecting portion which detects, based on image information representing the image of the actual printed-wiring board taken by the image taking device, four actual reference-point positions as respective actual positions of four actual reference points which correspond to the four ideal reference points, respectively, and which are predetermined on the actual printed-wiring board on which the actual electric component is to be mounted, an actual-division-point-position calculating portion which calculates, based on the four division ratios and the four actual reference-point positions, four actual division-point positions as respective actual positions of four actual division points which respectively divide, in the four division ratios, four actual sides of an actual quadrilateral defined by the four actual reference-point positions, and an actual-mounting-position calculating portion which calculates, as the actual mounting position, a position of an intersecting point where a first actual reference line which passes through two first actual division points of the four actual division points that correspond to the two first ideal division points, intersects a second actual reference line which passes through two second actual division points of the four actual division points that correspond to the two second ideal division points.

The present EC mounting apparatus can employ at least one of the second to fifth features (2) to (5).

(7) According to a seventh feature of the present invention, there is provided an apparatus for determining, according to at least one of at least one dimensional error and at least one positional error of an actual printed-wiring board, an actual mounting position where an actual electric component is to be mounted on the actual board, on a two-dimensional coordinate system defined by a first axis and a second axis, the apparatus comprising an ideal-relative-position obtaining means for obtaining an ideal relative position of an ideal mounting position which corresponds to the actual mounting position and where an ideal electric component which corresponds to the actual electric component is to be mounted on an ideal printed-wiring board which corresponds to the actual printed-wiring board and which has no dimensional error and no positional error, the ideal relative position being defined as a position of the ideal mounting position relative to four ideal reference-point positions as respective ideal positions of four ideal reference points predetermined on the ideal printed-wiring board, and being defined by four division ratios in which four ideal sides of an ideal quadrilateral defined by the four ideal reference-point positions are respectively divided by two first ideal division points where a first ideal reference line which is parallel to the first axis of the two-dimensional coordinate system and passes through the ideal mounting position intersects a first pair of opposed ideal sides of the four ideal sides of the ideal quadrilateral, and two second ideal division points where a second ideal reference line which is parallel to the second axis of the coordinate system and passes through the ideal mounting position intersects a second pair of opposed ideal sides of the four ideal sides of the ideal quadrilateral; an actual-reference-point-position detecting means for detecting four actual reference-point positions as respective actual positions of four actual reference points which correspond to the four ideal reference points, respectively, and which are predetermined on the actual printed-wiring board on which the actual electric component is to be mounted; an actual-division-point-position calculating means for calculating, based on the four division ratios and the four actual reference-point positions, four actual division-point positions as respective actual positions of four actual division points which respectively divide, in the four division ratios, four actual sides of an actual quadrilateral defined by the four actual reference-point positions; and an actual-mounting-position calculating means for calculating, as the actual mounting position, a position of an intersecting point where a first actual reference line which passes through a first pair of actual division points of the four actual division points that correspond to the two ideal division points, intersects a second actual reference line which passes through two second actual division points of the four actual division points that correspond to the two second ideal division points.

(8) According to an eighth feature of the present invention, there is provided an apparatus for determining, according to at least one of at least one dimensional error and at least one positional error of an actual printed-wiring board, an actual mounting position where an actual electric component is to be mounted on the actual board, on a two-dimensional coordinate system defined by a first axis and a second axis, the apparatus comprising an image taking device which takes an image of the actual printed-wiring board; an ideal-relative-position obtaining means for obtaining an ideal relative position of an ideal mounting position which corresponds to the actual mounting position and where an ideal electric component which corresponds to the actual electric component is to be mounted on an ideal printed-wiring board which corresponds to the actual printed-wiring board and which has no dimensional error and no positional error, the ideal relative position being defined as a position of the ideal mounting position relative to four ideal reference-point positions as respective ideal positions of four ideal reference points predetermined on the ideal printed-wiring board, and being defined by four division ratios in which four ideal sides of an ideal quadrilateral defined by the four ideal reference-point positions are respectively divided by two first ideal division points where a first ideal reference line which is parallel to the first axis of the two-dimensional coordinate system and passes through the ideal mounting position intersects a first pair of opposed ideal sides of the four ideal sides of the ideal quadrilateral, and two second ideal division points where a second ideal reference line which is parallel to the second axis of the coordinate system and passes through the ideal mounting position intersects a second pair of opposed ideal sides of the four ideal sides of the ideal quadrilateral; an actual-reference-point-position detecting means for detecting, based on image information representing the image of the actual printed-wiring board taken by the image taking device, four actual reference-point positions as respective actual positions of four actual reference points which correspond to the four ideal reference points, respectively, and which are predetermined on the actual printed-wiring board on which the actual electric component is to be mounted; an actual-division-point-position calculating means for calculating, based on the four division ratios and the four actual reference-point positions, four actual division-point positions as respective actual positions of four actual division points which respectively divide, in the four division ratios, four actual sides of an actual quadrilateral defined by the four actual reference-point positions; and an actual-mounting-position calculating means for calculating, as the actual mounting position, a position of an intersecting point where a first actual reference line which passes through a first pair of actual division points of the four actual division points that correspond to the two ideal division points, intersects a second actual reference line which passes through two second actual division points of the four actual division points that correspond to the two second ideal division points.

(9) According to a ninth feature of the present invention, there is provided a recording medium on which a mounting-position correcting program is recorded such that the program is readable by a computer to determine, according to at least one of at least one dimensional error and at least one positional error of an actual printed-wiring board, an actual mounting position where an actual electric component is to be mounted on the actual board, on a two-dimensional coordinate system defined by a first axis and a second axis, the program comprising the steps of obtaining an ideal relative position of an ideal mounting position which corresponds to the actual mounting position and where an ideal electric component which corresponds to the actual electric component is to be mounted on an ideal printed-wiring board which corresponds to the actual printed-wiring board and which has no dimensional error and no positional error, the ideal relative position being defined as a position of the ideal mounting position relative to four ideal reference-point positions as respective ideal positions of four ideal reference points predetermined on the ideal printed-wiring board, and being defined by four division ratios in which four ideal sides of an ideal quadrilateral defined by the four ideal reference-point positions are respectively divided by two first ideal division points where a first ideal reference line which is parallel to the first axis of the two-dimensional coordinate system and passes through the ideal mounting position intersects a first pair of opposed ideal sides of the four ideal sides of the ideal quadrilateral, and two second ideal division points where a second ideal reference line which is parallel to the second axis of the coordinate system and passes through the ideal mounting position intersects a second pair of opposed ideal sides of the four ideal sides of the ideal quadrilateral, detecting four actual reference-point positions as respective actual positions of four actual reference points which correspond to the four ideal reference points, respectively, and which are predetermined on the actual printed-wiring board on which the actual electric component is to be mounted, calculating, based on the four division ratios and the four actual reference-point positions, four actual division-point positions as respective actual positions of four actual division points which respectively divide, in the four division ratios, four actual sides of an actual quadrilateral defined by the four actual reference-point positions, and calculating, as the actual mounting position, a position of an intersecting point where a first actual reference line which passes through two first actual division points of the four actual division points that correspond to the two first ideal division points, intersects a second actual reference line which passes through two second actual division points of the four actual division points that correspond to the two second ideal division points.

The mounting-position correcting program recorded on the present recording medium can employ at least one of the second to fifth features (2) to (5).

BRIEF DESCRIPTION OF DRAWINGS

The above and optional objects, features, and advantages of the present invention will be better understood by reading the following detailed description of the preferred embodiments of the invention, when considered in connection with the accompanying drawings, in which.

DETAILED DESCRIPTION OF PREFERRED EMBODIMENTS

Figure 1:
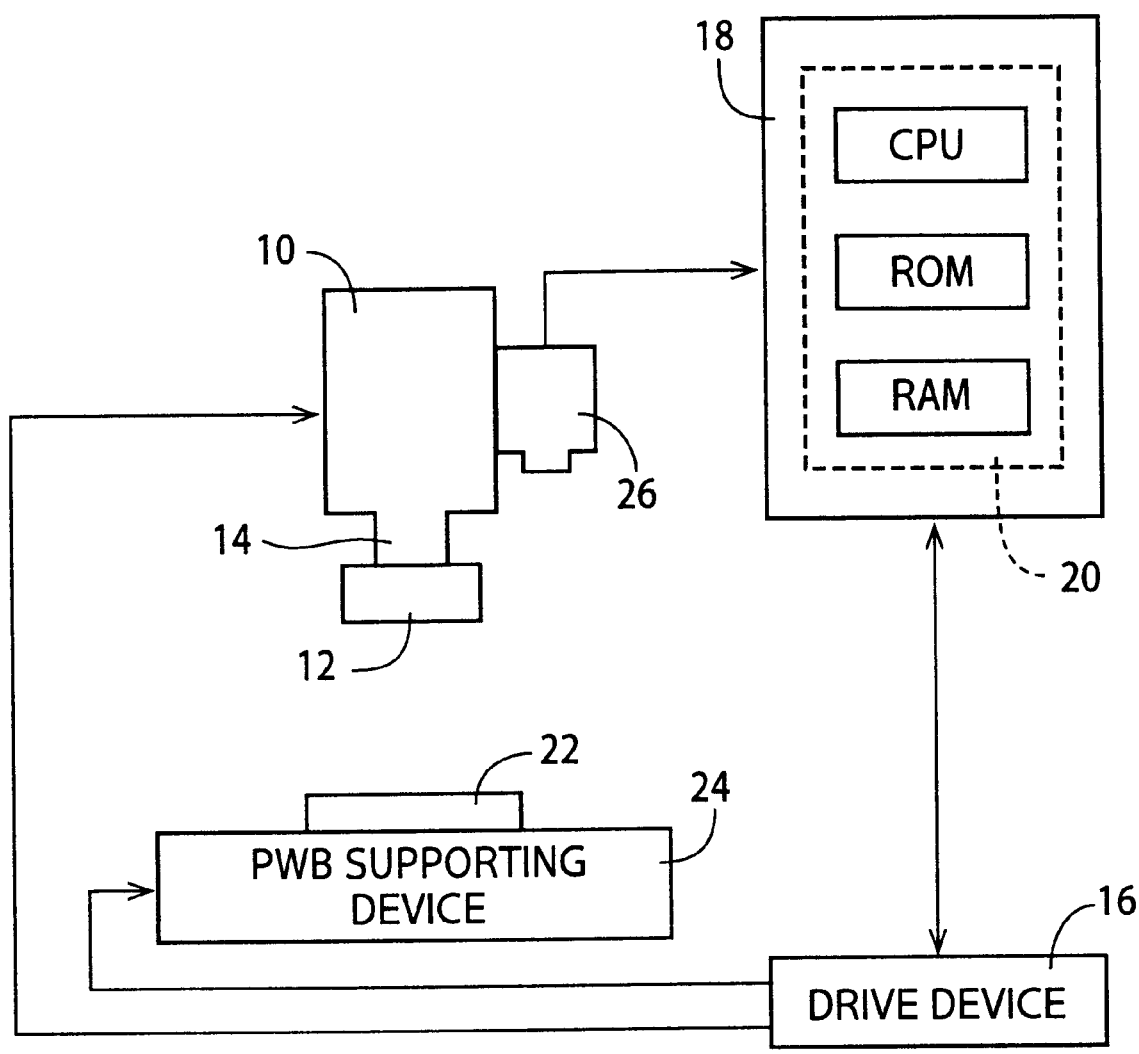
FIG. 1 is a diagrammatic view of an electric construction of an electric-component ("EC") mounting system embodying the present invention.

Hereinafter, there will be described an electric-component ("EC") mounting system embodying the present invention, by reference to FIGS. 1 and 2.

Figure 2:
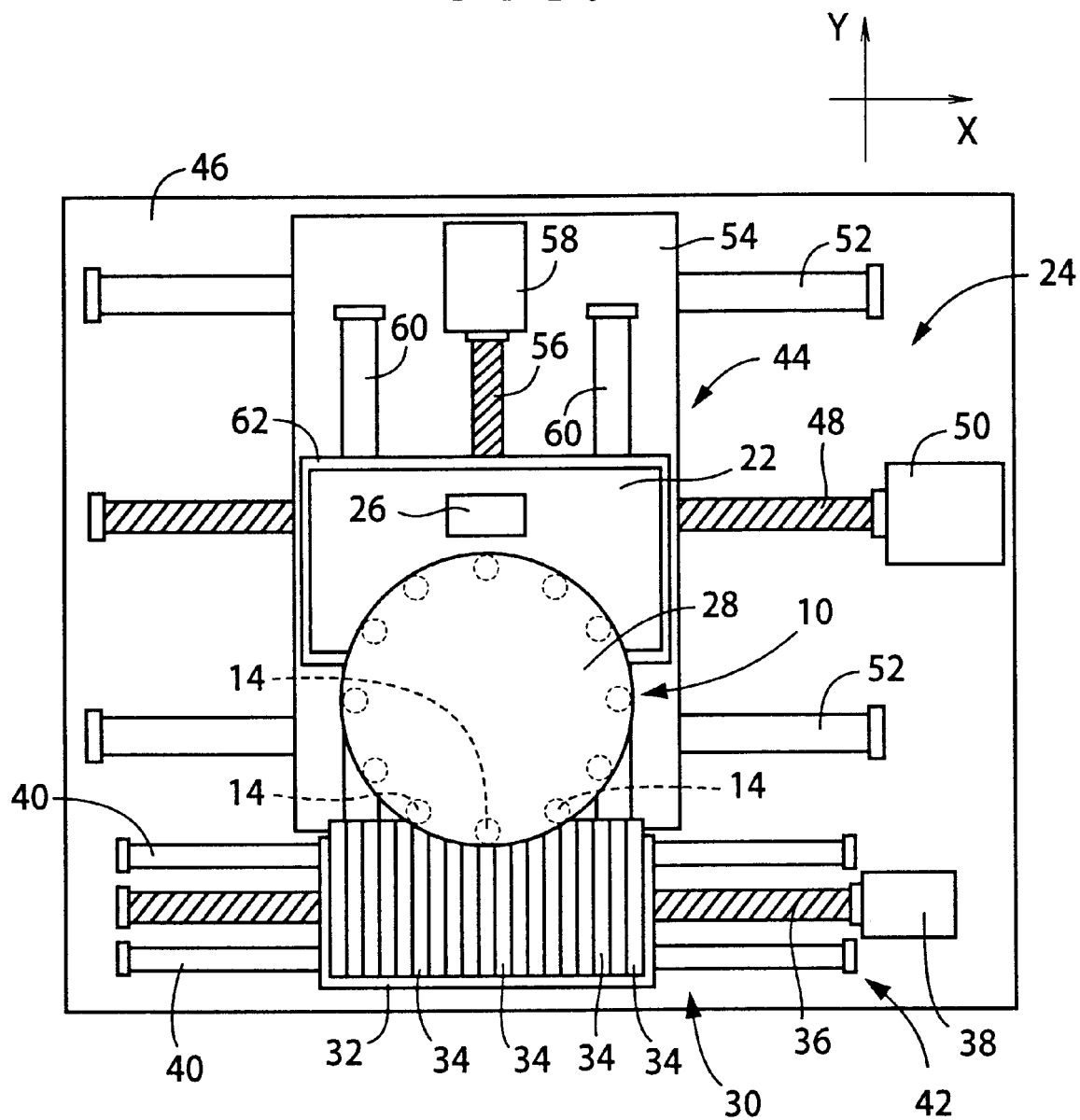
FIG. 2 is an illustrative view of a mechanical construction of the EC mounting system of FIG. 1.

FIG. 2 shows a general construction of the present EC mounting system. The EC mounting system includes an EC mounting device 10 which includes a plurality of EC mounting heads 14 each of which holds an electric component ("EC") 12 and transfers the EC 12 to an EC-mount stop position. The EC mounting device 10 includes various actuators which are connected to, and driven by, respective drive circuits of a drive device 16. The drive device 16 is connected to a control device 18 which controls the drive device 16 and thereby controls the operation of the EC mounting device 10. The control device 18 is essentially provided by a computer 20 including a central processing unit ("CPU"), a read only memory ("ROM"), and a random access memory ("RAM"). The drive device 16 is further connected to various actuators of a printed-wiring-board ("PWB") supporting device 24 which moves a printed wiring board ("PWB") 22 on a horizontal plane and positions the PWB 22 at a "controlled" position on the horizontal plane. The "controlled" position is defined as a position where a prescribed EC-mount position on the PWB 22 where an EC 12 is to be mounted is positioned right below one EC mounting head 14 which is being positioned at the EC-mount stop position. A camera 26 as an image taking device is fixed to a support member (not shown), such that the camera 26 is provided above the PWB supporting device 24 and takes an image of the PWB 22 supported by the device 24. The camera 26 is connected to the control device 18, and supplies image information representing the taken image of the PWB 22, to the control device 18.

However, in a different sort of EC mounting system in which a PWB 22 is positioned and kept at a prescribed position and one or more EC mounting heads 14 are moved to a plurality of prescribed EC-mount positions on the PWB 22, along a plane parallel to an upper surface of the PWB 22, a camera 26 may be provided on a movable member on which the EC mounting head or heads 14 is or are provided.

Next, the EC mounting device 10 will be described in more detail. As shown in FIG. 2, the EC mounting device 10 is of so-called "intermittent-rotation" type, i.e., includes an index table 28 which is intermittently rotated about a vertical axis. Since the intermittent-rotation-type EC mounting device 10 is well known in the art, e.g., disclosed in Japanese Patent Application published under No. 11-204995 and the corresponding U.S. patent application Ser. No. 09/204,311, the device 10 will be briefly described below.

The index table 28 supports a plurality of EC suction heads 14 each of which applies negative pressure or vacuum to an EC 12 and thereby holds the EC 12, such that the heads 14 are equiangularly spaced from each other about the vertical axis line about which the index table 28 is intermittently rotated. Each EC suction head 14 is a sort of EC mounting head, and includes a suction nozzle (not shown) which is rotatable about a vertical, central axis line thereof by a nozzle rotating device (not shown). The index table 28 is intermittently rotated by an intermittent-rotation device (not shown) which is constituted by a cam, a cam follower, a rotary shaft, an index servomotor which rotates the cam, etc. As the index table 28 is intermittently rotated, each of the EC suction heads 14 is sequentially moved to, and stopped at, each of a plurality of stop positions including an EC-suck (i.e., EC-supply) stop position, an EC-posture-detect stop position, an EC-posture-correct stop position, and the EC-mount stop position where each EC suction head 14 mounts the EC 12 on the PWB 22. At each of the EC-suck stop position and the EC-mount stop position, a head elevating and lowering device (not shown) is provided which lowers and elevates each EC suction head 14. The head elevating and lowering device includes a motion converting mechanism including a cam and a cam follower, and an elevator member which is lowered and elevated by the motion converting mechanism that converts and transmits the rotation of the above-indicated index servomotor to the elevator member. Thus, each EC suction head 14 is lowered and elevated at each of the EC-suck stop position and the EC-mount stop position.

However, the EC mounting device 10 may be replaced with a "rotary-plate" type EC mounting device which is disclosed in Japanese Patent Application published under 9-237997 and the corresponding U.S. Pat. No. 5,926,950, or a "rotatable-body-moving" type EC mounting device which is disclosed in Japanese Patent Application No. 11-95256 and the corresponding U.S. patent application No. 09/524,565. The "rotary-plate" type EC mounting device includes a plurality of rotary plates each of which is supported by a stationary shaft via a pair of bearings such that the each rotary plate is rotatable about an axis line of the stationary shaft. The rotatable-body-moving" type EC mounting device includes a rotatable body which supports a plurality of EC suction heads, is rotatable about a vertical or inclined axis line, and is movable relative to a base to an arbitrary position on a horizontal plane.

An EC supplying device 30 which supplies ECs 12 to the EC mounting device 10 is provided on the side of the EC-suck position of the index table 28. The EC supplying device 30 includes a plurality of EC feeders 34 and a feeder support table 32 to which each of the EC feeders 34 is detachably attached. The support table 32 supports the EC feeders 34 such that respective EC-supply portions of the EC feeders 34 are arranged along a horizontal straight line, i.e., in an X-axis direction. The support table 32 is moved in the X-axis direction while being guided by a pair of guide rails 40, when a ball screw 36 is rotated by an X-axis servomotor 38. Thus, the EC-supply portion of an appropriate one of the EC feeders 34 is positioned at an EC-supply position (i.e., the EC-suck stop position of the index table 28). The ball screw 36, the X-axis servomotor 38, and the guide rails 40 cooperate with one another to provide a table moving device 42. In the present embodiment, each EC feeder 34 includes (a) a main portion including a main frame and an EC-tape feeding mechanism as a sort of EC feeding mechanism, and (b) an EC-tape-reel holding portion as a sort of EC holding portion. Thus, each EC feeder 34 feeds ECs 12 in the form of an EC tape which carries a plurality of ECs on a carrier tape.

The PWB supporting device 24 includes an X-Y table 44 on which the PWB 22 is placed. The X-Y table 44 is movable to an arbitrary position on an X-Y plane, i.e., an X-Y rectangular coordinate system which is provided for the present EC mounting system. When each EC 12 is mounted on the PWB 22, the X-Y table 44 is moved to position the PWB 22 at the above-described "controlled" position. The PWB supporting device 24, the EC mounting device 10, and the EC supplying device 30 are provided on a base 46. Each PWB 22 is carried in onto the PWB supporting device 24 by a PWB carry-in device (not shown), and is carried out of the PWB supporting device 24 by a PWB carry-out device (not shown). Each of the carry-in and carry-out devices includes a belt conveyor which conveys each PWB 22 in the X-axis direction. As shown in FIG. 2, the X-Y table 44 includes an X-axis table 54 which is linearly moved in the X-axis direction while being guided by a pair of guide rails 52 when a ball screw 48 is rotated by an X-axis servomotor 50, and a Y-axis table 62 which is provided on the X-axis table 54 and is linearly moved in a Y-axis direction perpendicular to the X-axis direction while being guided by a pair of guide rails 60 when a ball screw 56 is rotated by a Y-axis servomotor 58. Each of the various servomotors 38, 50, 58 employed in the present system is an electric motor as a sort of drive source, and a rotary motor which is accurately controllable with respect to its rotation direction and angle. The servomotors may be replaced with stepper motors. The rotary motors may be replaced with linear motors.

The support member (not shown) to which the camera 26 is fixed, is fixed to the base 46, such that the camera 26 is provided at the same X-axis-direction position as that of the EC-suck stop position of each EC suction head 14 and faces downward toward the PWB 22 supported by the PWB supporting device 24. When the current PWB 22 is positioned at a controlled position, the camera 26 takes an image of an upper surface of the PWB 22.

Figure 3:
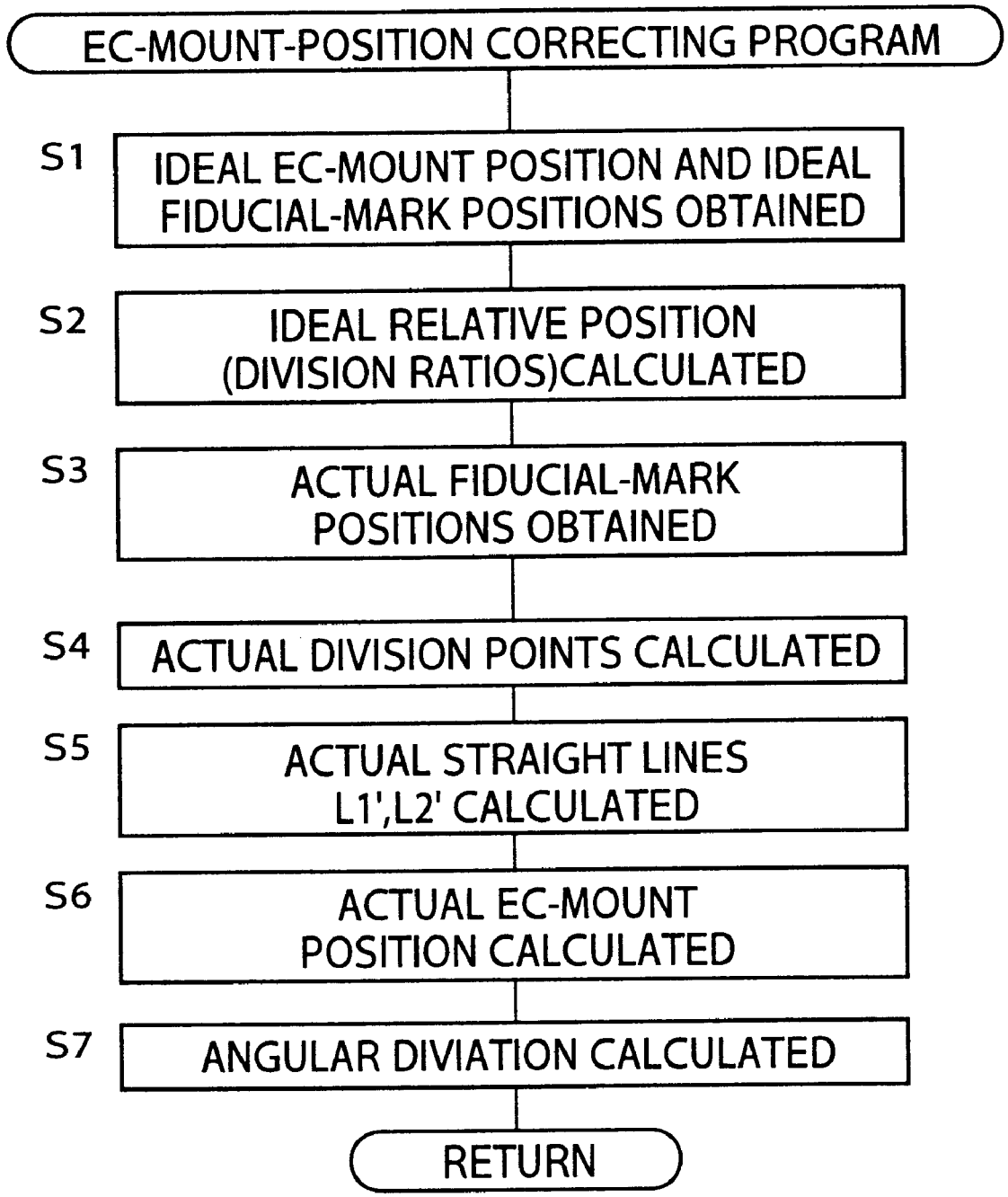
FIG. 3 is a flow chart representing an EC-mount-position correcting program which is pre-stored in a read only memory ("ROM") of a computer of a control device of the EC mounting system of FIG. 1.

Next, the operation of the present EC mounting system will be described by reference to the flow chart of FIG. 3 that represents an EC-mount-position correcting program which is pre-stored in the ROM of the computer 20 of the control device 18. When an operator operates an operation panel (not shown) to input an EC-mount command, a current PWB 22 is carried in, and supported on, the X-Y table 44 of the PWB supporting device 24, and the EC-mount-position correcting program is carried by the computer 20 of the control device 18.

Figure 4:
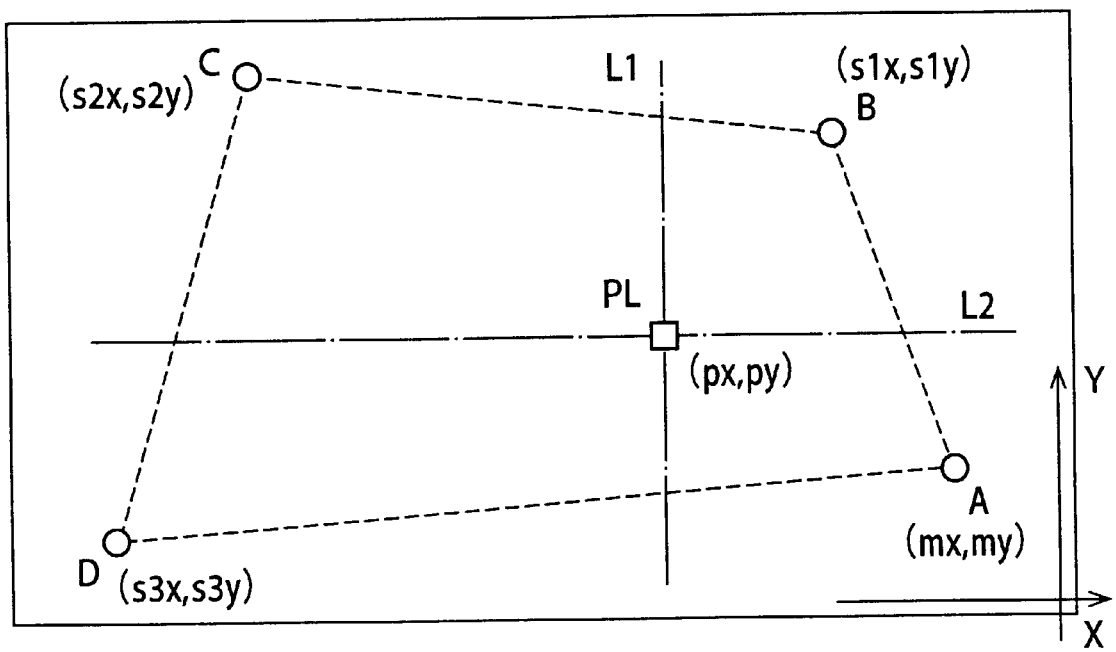
FIG. 4 is a view showing respective ideal positions of fiducial marks provided on an ideal printed-wiring board ("PWB")

The computer 20 reads, from the ROM thereof, a set of x and y coordinates representing a current EC-mount position where a current EC 12 is to be mounted on the current PWB 22, and four sets of x and y coordinates representing respective positions of four fiducial marks provided on the current PWB 22, and calculates, based on the thus read sets of x and y coordinates, a relative position of the EC-mount position relative to the four fiducial marks. It is preferred that the four fiducial marks be respectively provided in four quadrants of an X-Y rectangular coordinate system whose origin coincides with the center of the PWB 22. In the present embodiment, four fiducial marks, A, B, C, and D, are provided at respective positions, as shown in FIG. 4. FIG. 4 shows a set of x and y coordinates, PL ($p_x$, $p_y$) representing an ideal EC-mount position, PL, and four sets of x and y coordinates, A ($m_x$, $m_y$), B ($s_{1x}$, $s_{1y}$), C ($s_{2x}$, $s_{2y}$), and D ($s_{3x}$, $s_{3y}$), representing respective ideal positions of four fiducial marks, A, B, C, and D, assuming an ideal case where the current PWB 22 has acquired no dimensional errors before the current EC 12 is mounted thereon and the current PWB 22 has been positioned at a controlled position where the current EC-mount position on the PWB 22 is accurately positioned right below one EC suction head 14 which is holding the current EC 12 and is being positioned at the EC-mount stop position of the index table 28. The sets of x and y coordinates representing the ideal EC-mount position PL and the respective ideal positions of the four fiducial marks A, B, C, D are pre-stored in the ROM of the computer 18, and are read out to calculate the ideal relative position of the ideal EC-mount position PL ($p_x$, $p_y$) relative to the respective ideal positions ($m_x$, $m_y$), ($s_{1x}$, $s_{1y}$), ($s_{2x}$, $s_{2y}$), and ($s_{3x}$, $s_{3y}$) of the four fiducial marks A, B, C, D, as explained below.

After the current PWB 22 is carried in onto, and supported by, the PWB supporting device 24 as described above, the PWB 22 is moved to a controlled position by the supporting device 24 while the camera 26 takes respective images of the upper surface of the PWB 22. The camera 26 supplies image information representing the taken images, to the control device 18. Based on the image information supplied from the camera 26, the control device 18 or the computer 20 thereof determines four sets of x and y coordinates representing respective actual positions of actual fiducial marks A', B', C', and D', indicated at broken lines in FIG. 5. The computer 20 calculates, based on the relative position of the ideal EC-mount position PL and the four sets of x and y coordinates representing the respective actual positions of the actual fiducial marks A', B', C', and D', an actual EC-mount position, p1 (X, Y), where the current EC 12 is to be mounted on the current PWB 22. In addition, the computer 20 calculates, as a correction amount, an amount of deviation of the actual EC-mount position p1 (X, Y) from the ideal EC-mount position PL ($p_x$, $p_y$) pre-stored in the ROM, and corrects, based on the correction amount, the controlled position of the PWB 22 or the X-Y table 44, so that the current EC 12 is mounted on the PWB 22 being thus positioned at the corrected position.

The EC-mount-position correcting program will be described in more detail, by reference to the flow chart of FIG. 3.

At Step S1, the control device 18 reads, from the data pre-stored in the ROM of the computer 20 thereof, the set of x and y coordinates PL ($p_x$, $p_y$) representing the ideal EC-mount position PL where the current EC 12 is to be mounted on the current PWB 22, and the four sets of x and y coordinates, A ($m_x$, $m_y$), B ($s_{1x}$, $s_{1y}$), C ($s_{2x}$, $s_{2y}$), and D ($s_{3x}$, $s_{3y}$), representing the respective ideal positions of the four fiducial marks A, B, C, and D on the current PWB 22.

At Step S2, the control device 18 calculates a relative position of the ideal EC-mount position PL relative to the four ideal fiducial-mark positions A, B, C, and D. More specifically described, as shown in FIG. 4, an ideal quadrilateral, ABCD, having the four ideal mark positions A, B, C, and D as the four vertices thereof is considered, and a first ideal straight line, L1, which is parallel to the Y axis and passes through the ideal EC-mount position PL, and a second ideal straight line, L2, which is parallel to the X axis and passes through the ideal EC-mount position PL are considered. First, two intersecting points where the first ideal line L1 intersects the first pair of sides, AB and DC, and two intersecting points where the second ideal line L2 intersects the second pair of sides, BC and AD, are determined. The thus determined four intersecting points function as four division points which divide the four sides AB, DC, BC, AD, respectively, in respective division ratios. Each of the four division ratios are calculated based on the respective x or y coordinates of the three points, i.e., the opposite-end points of the corresponding side and the division point dividing the corresponding side. For example, the division ratio for the side AB is calculated based on the respective y coordinates of the two ideal mark positions A, B and the y coordinate of the division point dividing the side AB. One of the x and y coordinates of each of the four division points is equal to one of the x and y coordinates of the ideal EC-mount position PL, because the first and second ideal lines L1, L2 which are parallel to the Y and X axes, respectively, pass through the ideal EC-mount position PL. For example, as to the division point for the side AB, the y coordinate of the division point is known to be equal to the y coordinate, $p_y$, of the ideal EC-mount position PL, as illustrated in FIG. 4, even if the x coordinate of the division point may be unknown. Therefore, the division ratio for the side AB is obtained as the ratio of the difference of the y coordinate of the division point from that of the ideal mark position A to the difference of the y coordinate of the ideal mark position B from that of the ideal mark position A, that is, $(p_y-m_y)/(s_{1y}-m_y)$. The respective division ratios for the other, three sides of the ideal quadrilateral ABCD are obtained as follows:

Side DC: $(p_y-s_{3y})/(s_{2y}-s_{3y})$

Side BC: $(p_x-s_{1x})/(s_{2x}-s_{1x})$

Side AD: $(p_x-m_x)/(s_{3x}-m_x)$

The above-described technique to calculate the four division ratios as the ideal relative position of the ideal EC-mount position PL can apply to the case where the ideal EC-mount position PL is located outside the ideal quadrilateral ABCD. In the latter case, one or more of the four sides AB, DC, BC, AD may be extended to find a corresponding division point or points, and one or more of the four division ratios may be greater than one or smaller than zero.

Figure 5:
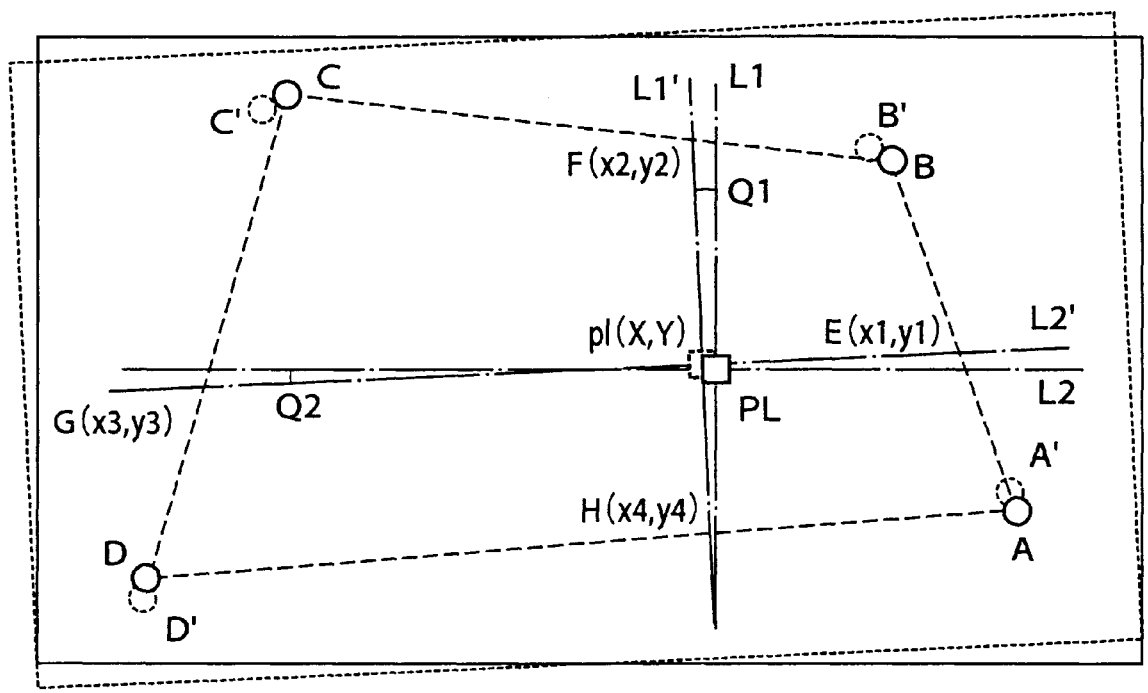
FIG. 5 is a view showing an actual shape of an actual PWB and respective actual positions of fiducial marks provided on an actual PWB.

Next, at Step S3, the control device 18 determines, based on the image information supplied from the camera 26, four sets of x and y coordinates representing respective actual positions of the four actual fiducial marks A', B', C', and D' provided on the current PWB 22 on which the current EC 12 is to be mounted. In FIG. 5, an ideal shape of the current PWB 22 and the respective ideal positions of the four fiducial marks A, B, C, D are indicated at solid lines, and an actual shape of the current PWB 22, imaged by the camera 26, and the respective actual positions of the four actual fiducial marks A', B', C', D' are indicated at broken lines. Here, respective amounts of deviation of the actual mark position A' from the ideal mark position A are expressed as $(m_{rx}, m_{ry})$; respective amounts of deviation of the actual mark position B' from the ideal mark position B are expressed as $(s_{1rx}, s_{1ry})$; respective amounts of deviation of the actual mark position C' from the ideal mark position C are expressed as $(s_{2rx}, s_{2ry})$; and respective amounts of deviation of the actual mark position D' from the ideal mark position D are expressed as $(s_{3rx}, s_{3ry})$. Hence, the respective sets of x and y coordinates representing the four actual mark positions A', B', C', D' are expressed, as follows:

$$A'(m_x+m_{rx}, m_y+m_{ry})$$

$$B'(s_{1x}+s_{1rx}, s_{1y}+s_{1ry})$$

$$C'(s_{2x}+s_{2rx}, s_{2y}+s_{2ry})$$

$$D'(s_{3x}+s_{3rx}, s_{3y}+s_{3ry})$$

However, the set of x and y coordinates of each of the four actual mark positions A', B', C', D' can be obtained as a set of x and y coordinates which are independent of the set of x and y coordinates of a corresponding one of the ideal mark positions A, B, C, D.

Next, at Step S4, the control device 18 calculates respective sets of x and y coordinates representing four actual division points, E, F, G, and H, shown in FIG. 5, which divide the four sides, A'B', D'C', B'C', A'D', of the actual quadrilateral A'B'C'D' in the corresponding division ratios determined at Step S2.

For example, as to the actual division point E which divides the actual side A'B', an x coordinate, $x_1$, of the division point E is equal to the sum of (i) the x coordinate $(m_x+m_{rx})$ and (ii) the product of the difference of the x coordinate of the actual mark position B' from that of the actual mark position A' and the division ratio determined at Step S2 for the ideal side AB. Similarly, the respective x coordinates of the other, three division points F, G, H and the respective y coordinates of the four division points E, F, G, H are calculated. Thus, the respective sets of x and y coordinates, $(x_1, y_1)$, $(x_2, y_2)$, $(x_3, y_3)$, $(x_4, y_4)$, of the four actual division points, E, F, G, and H are expressed as follows:

$$x_1=m_x+m_{rx}+(s_{1x}+s_{1rx}-(m_x+m_{rx}))\times(p_y-m_y)/(s_{1y}-m_y)$$

$$y_1=m_y+m_{ry}+(s_{1y}+s_{1ry}-(m_y+m_{ry}))\times(p_y-m_y)/(s_{1y}-m_y)$$

$$x_2=s_{1x}+s_{1rx}+(s_{2x}+s_{2rx}-(s_{1x}+s_{1rx}))\times(p_x-s_{1x})/(s_{2x}-s_{1x})$$

$$y_2=s_{1y}+s_{1ry}+(s_{2y}+s_{2ry}-(s_{1y}+s_{1ry}))\times(p_x-s_{1x})/(s_{2x}-s_{1x})$$

$$x_3=s_{3x}+s_{3rx}+(s_{2x}+s_{2rx}-(s_{3x}+s_{3rx}))\times(p_y-s_{3y})/(s_{2y}-s_{3y})$$

$$y_3=s_{3y}+s_{3ry}+(s_{2y}+s_{2ry}-(s_{3y}+s_{3ry}))\times(p_y-s_{3y})/(s_{2y}-s_{3y})$$

$$x_4=m_x+m_{rx}+(s_{3x}+s_{3rx}-(m_x+m_{rx}))\times(p_x-m_x)/(s_{3x}-m_x)$$

$$y_4=m_y+m_{ry}+(s_{3y}+s_{3ry}-(m_y+m_{ry}))\times(p_x-m_x)/(s_{3x}-m_x)$$

Next, at Step S5, the control device 18 calculates a first actual straight line, L1', passing through the two division points F, H which divide the two opposed sides B'C', A'D', respectively, and a second straight line, L2', passing through the two division points E, G which divide the other, two opposed sides A'B', D'C', respectively. The thus determined two actual lines L1', L2' are expressed as follows:

$$L1': Y=a_2\times X+b_2$$

$$L2': Y=a_1\times X+b_1$$

where $$a_1=(y_3-y_1)/(x_3-x_1)$$

$$a_2=(y_4-y_2)/(x_4-x_2)$$

$$b_1=y_1-a_1\times x_1$$

$$b_2=y_2-a_2\times x_2$$

In the case where $a_1$ or $a_2$ is infinite, that is, the first or second actual line L1', L2' is parallel to the Y axis, the first or second actual line L1', L2' is expressed as follows:

In the case where $a_1$ is infinite, i.e., $x_3=x_1$, $$X=b_1, b_1=x_1$$

In the case where $a_2$ is infinite, i.e., $x_4=x_2$, $$X=b_2, b_2=x_2$$

Next, at Step S6, the control device 18 calculates a set of x and y coordinates representing the actual EC-mount position, p1 (X, Y), where the current EC 12 is to be mounted on the current PWB 22. The actual EC-mount position, p1 (X, Y), is obtained as an intersecting point of the two actual lines L1', L2'. Therefore, the x and y coordinates X, Y of the actual EC-mount position p1 (X, Y) are expressed as follows:

In the case where $a_1$ is infinite, $$X=b_1, Y=a_2\times b_1+b_2$$

In the case where $a_2$ is infinite, $$X=b_2, Y=a_1\times b_2+b_1$$

In the case where each of $a_1$ and $a_2$ is not infinite, $$X=(b_2-b_1)/(a_1-a_2), Y=a_1\times X+b_1$$

Then, the control device 18 obtains, as an X-axis-direction correction amount, $F_x$, and an Y-axis-direction correction amount, $F_y$, an amount of deviation of the x coordinate, X, of the actual EC-mount position p1 (X, Y) from that, $p_x$, of the ideal EC-mount position PL $(p_x, p_y)$, and an amount of deviation of the y coordinate, Y, of the actual EC-mount position p1 (X, Y) from that, $p_y$, of the ideal EC-mount position PL $(p_x, p_y)$, as follows:

X-Axis-Direction Correction Amount $F_X$:

$$F_X=X-p_x$$

Y-Axis-Direction Correction Amount $F_Y$:

$$F_Y=Y-p_y$$

Last, at Step S7, the control device 18 calculates, based on the respective slopes, $a_2$ and $a_1$, of the two actual lines L1', L2', an angular deviation, i.e., an angular correction amount, $F_Q$, at the actual EC-mount position p1 (X, Y). More specifically described, the angular correction amount FQ is obtained as the average of respective angular deviations of the two actual lines L1', L2' from the corresponding ideal lines L1, L2. For calculation purposes only, the slope, $Q_{p1}$, of the first ideal line L1 that is parallel to the Y axis is defined as 90 degrees for the case where the slope, $Q_{t1}$, of the first actual line L1' is greater than zero, i.e., $Q_{t1}>0$, and the slope $Q_{p1}$ of the first ideal line L1 is defined as –90 degrees for the case where the slope $Q_{t1}$, of the first actual line L1' is smaller than zero, i.e., $Q_{t1}<0$. The respective slopes of the two ideal lines L1, L2 and the two actual lines L1', L2' are expressed as follows:

Slope $Q_{p1}$ of Ideal Line L1: $Q_{p1}=90$ or $-90$ ($Q_{p1}=90$ for $Q_{t1}>0$, and $Q_{p1}=-90$ for $Q_{t1}<0$)

Slope $Q_{t1}$ of Actual Line L1': $Q_{t1}=\tan^{-1}((y_4-y_2)/(x_4-x_2))$

Angular Deviation, $Q_1$, of Line $L_1$' from Line L1: $Q_1=Q_{t1}-Q_{p1}$

Slope $Q_{p2}$ of Ideal Line L2: $Q_{p2}=0$

Slope $Q_{t2}$ of Actual Line L2': $Q_{t2}=\tan^{-1}((y_3-y_1)/(x_3-x_1))$

Angular Deviation, $Q_2$, of Line L2' from Line L2: $Q_2=Q_{t2}-Q_{p2}$

As is apparent from the foregoing explanation, the angular correction amount $F_Q$ is obtained as follows:

Angular Correction Amount $F_Q$: $F_Q=(Q_1+Q_2)/2$

The control device 18 controls, based on the X-axis-direction and Y-axis-direction correction amounts $F_X$, $F_Y$ determined at Step S6, the PWB supporting device 24 to move, by the respective distances $F_X$, $F_Y$, the X-Y table 44 from the above-described "controlled" position, i.e., the ideal position, to a new position appropriate for the current PWB 22. In addition, the control device 18 controls, based on the angular correction amount $F_Q$ determined at Step S7, the nozzle rotating device (not shown) to rotate, by the angle $F_Q$, the suction nozzle (not shown) of the current EC suction head 14 being positioned at the EC-mount stop position of the index table 28. Thus, the current EC 12 held by the current head 14 is mounted on the current PWB 22. Thus, one control cycle according to the EC-mount-position correcting program is finished.

As is apparent from the foregoing description, the step of performing Steps S1 and S2 of the EC-mount-position correcting program pre-stored in the ROM of the computer 20 provides the step of obtaining an ideal relative position of an ideal EC-mount position relative to ideal reference positions; the step of performing Step S3 of the EC-mount-position correcting program provides the step of detecting actual reference positions; and the step of performing Steps S4 to S7 of the EC-mount-position correcting program provides the step of calculating an actual EC-mount position.

In the present embodiment, the correction of the ideal EC-mount position PL pre-stored in the ROM needs the calculation of the four division ratios in which the four division points divide the four sides of the ideal quadrilateral ABCD, respectively. The four division ratios are calculated based on the ideal EC-mount position PL and the four ideal mark positions A, B, C, D all of which are pre-stored in the ROM. Because of this feature, the ROM may be one which has a small storage capacity. However, in the case where the ROM is one which has a large storage capacity, the four division ratios as the ideal relative position of the ideal EC-mount position PL relative to the four ideal mark positions A, B, C, D may be calculated in advance and pre-stored in the ROM. In the latter case, when the ideal EC-mount position PL is corrected, the computer 20 may read the four division ratios from the ROM.

The four division ratios which are calculated as the ideal relative position of the ideal EC-mount position PL on the first or initial PWB 22 may be temporarily stored in the RAM of the computer 20, so that those division ratios may be read out from the RAM by the computer 20 when the corresponding ideal EC-mount position PL on each of the following PWBs 22 is corrected.

In the present embodiment, the control device 18 determines the four actual mark positions A', B', C', D' for each of a plurality of actual PWBs 22 and determines, for each of the actual PWBs 22, the actual EC-mount position p1 corresponding to each of a plurality of ideal EC-mount positions PL. However, the control device 18 may be modified to determine the four actual mark positions A', B', C', D' for every second, third, fourth, actual PWB 22 and determine, for each of only those the actual PWBs 22, the actual EC-mount position p1 corresponding to each of a plurality of ideal EC-mount positions PL.

Here, the conventional relative-position calculating method, suggested in the previously-identified Japanese Patent Publication No. 8-236997, is explained by reference to FIG. 6.

Figure 6:
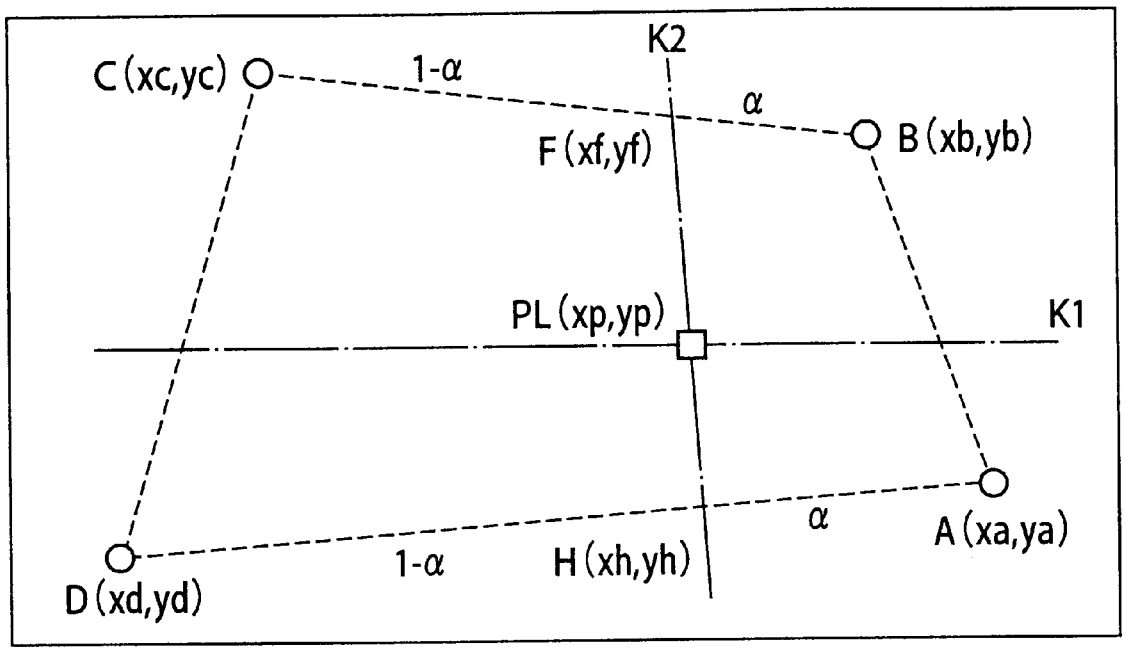
FIG. 6 is a view for explaining a relative-position calculating manner employed in a conventional EC-mount-position correcting method.

FIG. 6 shows an ideal EC-mount position PL ($x_p$, $y_p$), and respective ideal positions, ($x_a$, $y_a$), ($x_b$, $y_b$), ($x_c$, $y_c$), and ($x_d$, $y_d$), of four fiducial marks A, B, C, and D. The above Japanese Patent Publication suggests that an ideal relative position of the ideal EC-mount position PL relative to the four ideal fiducial-mark positions A, B, C, D is determined by determining a first ideal reference straight line, K1, which passes through the ideal EC-mount position PL and divides the two sides, AB and DC, in a same division ratio, and a second ideal reference straight line, K2, which passes through the ideal EC-mount position PL and divides the two sides, BC and AD, in a same division ratio. However, the Japanese Patent Publication does not disclose any concrete mathematical calculations. Hence, the Inventor has speculated those calculations, as follows: First, the second ideal reference line K2 which divides the two sides, BC, AD in a same division ratio, i.e., $\alpha$: 1–$\alpha$, and the parameter $\alpha$ are determined.

(I) A set of x and y coordinates, ($x_f$, $y_f$), of a division point, F, which divides the side BC in the division ratio, $\alpha$: 1–$\alpha$, is expressed using the parameter $\alpha$ and the respective sets of x and y coordinates, ($x_b$, $y_b$), ($x_c$, $y_c$), of the two ideal mark positions B, C, as follows:

$F(x_f, y_f)=(x_b+\alpha(x_c-x_b), y_b+\alpha(y_c-y_b))$

Here, assuming ($x_c-x_b$)=$C_{bx}$ and ($y_c-y_b$)=$C_{by}$, the division point F ($x_f$, $y_f$) is obtained, as follows:

$F(x_f, y_f)=(x_b+\alpha C_{bx}, y_b+\alpha C_{by})$ (II) A mathematical expression, $Y=a_1\times X+b_1$, representing the second ideal reference line K2 which passes through the division point F ($x_f$, $y_f$) and the ideal EC-mount position PL ($x_p$, $x_y$) is determined.

Since both the division point F ($x_f$, $y_f$) and the ideal EC-mount position PL ($x_p$, $x_y$) are present on the second ideal reference line K2, the following expressions are obtained:

$y_f=a_1\times x_f+b_1$     (i)

$y_p=a_1\times x_p+b_1$     (ii)

The coefficients, $a_1$ and $b_1$, are obtained, as follows:

$a_1=(y_p-y_f)/(p_x-x_f)$ $b_1=y_f-\{(y_p-y_f)/(x_p-x_f)\}\times x_f$

Here, using the results obtained in (I), the two coefficients $a_1$, $b_1$ are expressed, as follows:

$a_1=(y_p-y_b-\alpha C_{by})/(x_p-x_b-\alpha C_{bx})$ $b_1=y_b+\alpha C_{by}\{(y_p-y_b-\alpha C_{by})/(x_p-x_b-\alpha C_{bx})\}\times(x_b+\alpha C_{bx})$ (III) An expression, $Y=a_2 \times X+b_2$, representing a straight line which passes through the two ideal fiducial-mark positions A, D is determined, as follows:

$a_2=(y_d-y_a)/(p_d-x_a)$ $b_2=y_a-\{(y_d-y_a)/(x_d-x_a)\}\times x_a$ (IV) An intersecting point, H $(x_h, y_h)$, of the two straight lines K2, AD, obtained in (II) and (III), is determined.

Since the intersecting point H $(x_h, y_h)$ is present on both the two straight lines K2, AD, the following expressions are obtained:

$y_h=a_1 \times x_h+b_1$ $y_h a_2 \times x_h+b_2$

Thus, the x and y coordinates $(x_h, y_h)$ of the intersecting point H are obtained, as follows:

$x_h=(b_2-b_1)/(a_1-a_2)$ $y_h=a_1 \times (b_2-b_1)/(a_1-a_2)+b$ (V) The x and y coordinates $(x_h, y_h)$ of the intersecting point H are expressed using the parameter α and the respective sets of x and y coordinates, $(x_a, y_a)$, $(x_d, y_d)$, of the two ideal mark positions A, D, as follows:

$H(x_h, y_h)=(x_a+\alpha(x_d-x_a), y_a+\alpha(y_d-y_a))$

Here, assuming $(x_d-x_a)=D_{ax}$ and $(y_d-y_a)=D_{ay}$, the intersecting point H $(x_h, y_h)$ is obtained, as follows:

$H(x_h, y_h)=(x_a+\alpha D_{ax}, y_a+\alpha D_{ay})$ (VI) From the results obtained in (IV) and (V), the following equation (iii) is obtained, which includes the parameter α, the respective x and y coordinates $x_a, y_a, x_b, y_b, x_c, y_c, x_d, y_d$ of the four ideal fiducial-mark positions A, B, C, D, and the x and y coordinates $x_p, y_p$ of the ideal EC-mount position PL:

$x_a+\alpha D_{ax}=(b_2-b_1)/(a_1-a_2)$ (iii)

This equation (iii) is rewritten into the following equation with respect to the parameter α:

$a\alpha^2+b\alpha+c=0$ (iv)

where the coefficient a, b, and c are as follows:

$a=-D_{ax} \times C_{by}+a_2 \times D_{ax} \times C_{by}$ $b=(y_p-y_b) \times D_{ax}-a_2 \times (x_p-x_b) \times D_{ax}+(a_2 \times x_a-y_p+b_2) \times C_{bx}+(x_p-x_a) \times C_{by}$ $c=-b_2 \times (x_p-x_b)+y_b \times x_p-y_p \times x_b+x_a \times (y_p-y_b-a_2 \times (x_p-x_b))$ (VII) The parameter α is calculated as one of the two solutions of the above equation (iv), as follows:

$\alpha=(-b \pm (b^2-4_{ac})^{1/2})/2a$ (VIII) One of the two solutions for the parameter a is adopted as a correct solution.

Similarly, a division ratio, β, for dividing the other two sides AB, DC is determined.

Based on the thus determined two division ratios α, β and respective detected actual fiducial-mark positions A', B', C', D', an actual EC-mount position can be determined.

In the above-explained conventional relative-position calculating method, the unknown parameters α, β are employed to determine the two division ratios, and the two solutions of the quadratic equations for each of the two parameters α, β are calculated. Since the calculations of the solutions need complex calculations including calculations of roots. In addition, since respective slopes of two ideal reference lines K1, K2 for one ideal EC-mount position differ from those for another ideal EC-mount position, respective slopes of two ideal reference lines K1, K2 for each ideal EC-mount position must be calculated using trigonometric functions. Those calculations need much time, which leads to increasing the production efficiency.

In contrast thereto, the present EC-mount-position correcting method employs the two ideal reference lines L1, L2 which are parallel to the X and Y axes of the X-Y coordinate system, respectively. Therefore, it is easy to calculate the four division ratios. In addition, since the respective slopes of the two ideal reference lines L1, L2 are known in advance, it is not needed to calculate those slopes.

While the present invention has been described in its preferred embodiments, the present invention is not limited to the features described in SUMMARY OF INVENTION or the features described in PREFERRED EMBODIMENTS OF INVENTION, but may be embodied with other changes, improvements, and modifications that may occur to a person skilled in the art without departing from the scope and spirit of the invention defined in the appended claims.

What is claimed is:

1. A method of determining an actual mounting position for an electric component on a printed-wiring board, the method comprising the steps of:

obtaining a first ideal reference line extending parallel to a first axis of a two-dimensional coordinate system defined by the first axis and a second axis, and passing through an ideal mounting position corresponding to the actual mounting position, and a second ideal reference line extending parallel to the second axis of the coordinate system and passing through the ideal mounting position, obtaining, for the electric component, a relative position of the ideal mounting position relative to four ideal reference points, as four division ratios in which four sides of a quadrilateral defined by the four ideal reference points are divided by two first ideal division points where the first ideal reference line intersects a first pair of opposed sides of the quadrilateral, and two second ideal division points where the second ideal reference line intersects a second pair of opposed sides of the quadrilateral, detecting four actual reference points which correspond to the four ideal reference points, and which are predetermined on the printed-wiring board on which the electric component is to be mounted, calculating, based on said four division ratios and said four actual reference points, four actual division points which divide, in the four division ratios, four sides of a quadrilateral defined by the four actual reference points, and calculating, as the actual mounting position, a position of an intersecting point where a first actual reference line which passes through two first actual division points corresponding to said two first ideal division points intersects a second actual reference line which passes through two second actual division points corresponding to said two second ideal division points.

2. A method according to claim 1, wherein the step of calculating the actual mounting position comprises calculating, as at least one correction amount, at least one amount of deviation of the actual mounting position from the ideal mounting position on the two-dimensional coordinate system, so that at least one of the electric component and the printed-wiring board is displaced relative to the other of the electric component and the printed-wiring board, by said correction amount, before the electric component is mounted on the printed-wiring board.

3. A method according to claim 1, wherein the step of calculating the actual mounting position comprises calculating, based on at least one of respective angular deviation of respective slopes of the first and second actual reference lines from respective slopes of the first and second ideal reference lines on the two-dimensional coordinate system, an angular correction amount as an amount of deviation of an actual angular position of the printed-wiring board from an ideal angular position thereof about an axis line thereof perpendicular to an upper surface thereof, so that at least one of the electric component and the printed-wiring board is rotated about said axis line by said angular correction amount before the electric component is mounted on the printed-wiring board.

4. A method according to claim 3, wherein the step of calculating the angular correction amount comprises calculating the angular correction amount as an average of the respective angular deviations of the respective slopes of the first and second actual reference lines from the respective slopes of the first and second ideal reference lines.

5. A method according to claim 1, wherein the step of detecting the four actual reference points comprises detecting respective amounts of positional deviations of the four actual reference points from the four ideal reference points in each of a first direction and a second direction which are parallel to the first and second axes of the two-dimensional coordinate system, respectively, and detecting the four actual reference points as respective sums of the four ideal reference points and said respective amounts of positional deviations of the four actual reference points.

6. An electric-component mounting apparatus comprising:
   a mounting device which mounts at least one electric component at at least one actual mounting position on a printed-wiring board;
   a control device which controls the mounting device to mount the electric component at the actual mounting position on the printed-wiring board; and
   an image taking device which takes an image of the printed-wiring board,
   the control device comprising an ideal-reference-line obtaining portion which obtains a first ideal reference line extending parallel to a first axis of a two-dimensional coordinate system defined by the first axis and a second axis, and passing through an ideal mounting position corresponding to the actual mounting position, and a second ideal reference line extending parallel to the second axis of the coordinate system and passing through the ideal mounting position,
   an ideal-relative-position obtaining portion which obtains, for the electric component, a relative position of the ideal mounting position relative to four ideal reference points, as four division ratios in which four sides of a quadrilateral defined by the four ideal reference points are divided by two first ideal division points where the first ideal reference line intersects a first pair of opposed sides of the quadrilateral, and two second ideal division points where the second ideal reference line intersects a second pair of opposed sides of the quadrilateral,
   an actual-reference-point detecting portion which detects, based on image information representing the image of the printed-wiring board taken by the image taking device, four actual reference points which correspond to the four ideal reference points, and which are predetermined on the printed wiring board on which the electric component is to be mounted, an actual-division-point calculating portion which calculates, based on said four division ratios and said four actual reference points, four actual division points which divide, in the four division ratios, four sides of a quadrilateral defined by the four actual reference points, and
   an actual-mounting-position calculating portion which calculates, as the actual mounting position, a position of an intersecting point where a first actual reference line which passes through two first actual division points corresponding to said two first ideal division points intersects a second actual reference line which passes through two second actual division points corresponding to said two second ideal division points.

7. An apparatus for determining an actual mounting position for an electric component on a printed-wiring board, the apparatus comprising:
   an ideal-reference-line obtaining means for obtaining a first ideal reference line extending parallel to a first axis of a two-dimensional coordinate system defined by the first axis and a second axis, and passing through an ideal mounting position corresponding to the actual mounting position, and a second ideal reference line extending parallel to the second axis of the coordinate system and passing through the ideal mounting position;
   an ideal-relative-position obtaining means for obtaining, for the electric component, a relative position of the ideal mounting position relative to four ideal reference points, as four division ratios in which four sides of a quadrilateral defined by the four ideal reference points are divided by two first ideal division points where the first ideal reference line intersects a first pair of opposed sides of the quadrilateral, and two second ideal division points where the second ideal reference line intersects a second pair of opposed sides of the quadrilateral;
   an actual-reference-point detecting means for detecting four actual reference points which correspond to the four ideal reference points, and which are predetermined on the printed-wiring board on which the electric component is to be mounted;
   an actual-division-point calculating means for calculating, based on said four division ratios and said four actual reference points, four actual division points which divide, in the four division ratios, four sides of a quadrilateral defined by the four actual reference points; and
   an actual-mounting-position calculating means for calculating, as the actual mounting position, a position of an intersecting point where a first actual reference line which passes through two first actual division points corresponding to said two first ideal division points intersects a second actual reference line which passes through two second actual division points corresponding to said two second ideal division points.

8. An apparatus according to claim 7, further comprising an image taking device which takes an image of the printed-wiring board, wherein the actual-reference-point detecting means detects the four actual reference points, based on image information representing the image of the printed-wiring board taken by the image taking device.

9. A recording medium on which a mounting-position correcting program is recorded such that the program is readable by a computer to determine an actual mounting position for an electric component on a printed-wiring board, the program comprising the steps of:

obtaining a first ideal reference line extending parallel to a first axis of a two-dimensional coordinate system defined by the first axis and a second axis, and passing through an ideal mounting position corresponding to the actual mounting position, and a second ideal reference line extending parallel to the second axis of the coordinate system and passing through the ideal mounting position, obtaining, for the electric component, a relative position of the ideal mounting position relative to four ideal reference points, as four division ratios in which four sides of a quadrilateral defined by the four ideal reference points are divided by two first ideal division points where the first ideal reference line intersects a first pair of opposed sides of the quadrilateral, and two second ideal division points where the second ideal reference line intersects a second pair of opposed sides of the quadrilateral, detecting four actual reference points which correspond to the four ideal reference points, and which are predetermined on the printed-wiring board on which the electric component is to be mounted, calculating, based on said four division ratios and said four actual reference points, four actual division points which divide, in the four division ratios, four sides of a quadrilateral defined by the four actual reference points, and calculating, as the actual mounting position, a position of an intersecting point where a first actual reference line which passes through two first actual division points corresponding to said two first ideal division points intersects a second actual reference line which passes through two second actual division points corresponding to said two second ideal division points.

10. A method according to claim 1, wherein at least one of the four sides of the quadrilateral defined by the four ideal reference points is not parallel to each of the first and second axes of the two-dimensional coordinate system.

11. An apparatus according to claim 7, wherein at least one of the four sides of the quadrilateral defined by the four ideal reference points is not parallel to each of the first and second axes of the two-dimensional coordinate system.

12. A recording medium according to claim 9, wherein at least one of the four sides of the quadrilateral defined by the four ideal reference points is not parallel to each of the first and second axes of the two-dimensional coordinate system.

* * * * *